United States Patent
Ramos et al.

(10) Patent No.: US 10,384,325 B2
(45) Date of Patent: Aug. 20, 2019

(54) DUAL-THICKNESS BACKGRINDING TAPE FOR BACKGRINDING BUMPED WAFERS

(71) Applicant: Texas Instruments Incorporated, Dallas, TX (US)

(72) Inventors: Randy Collo Ramos, Baguio (PH); Jeniffer Viera Otero, Baguio (PH); Mark Daniel Pabalate Minoc, Naic Cavite (PH); Cherry Lyn Marquez Aranas, Mabalacat Pampanga (PH); Russel Rosales Borreo, Mabalacat (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 349 days.

(21) Appl. No.: 15/089,953

(22) Filed: Apr. 4, 2016

(65) Prior Publication Data

US 2017/0282326 A1    Oct. 5, 2017

(51) Int. Cl.
*H01L 21/683*    (2006.01)
*B24B 37/04*     (2012.01)

(52) U.S. Cl.
CPC ........ *B24B 37/042* (2013.01); *H01L 21/6836* (2013.01); *H01L 21/6838* (2013.01); *H01L 2221/6834* (2013.01); *H01L 2221/68327* (2013.01)

(58) Field of Classification Search
None
See application file for complete search history.

(56) References Cited

U.S. PATENT DOCUMENTS

| | | |
|---|---|---|
| 6,949,158 B2 | 9/2005 | Ball et al. |
| 2011/0230043 A1 | 9/2011 | Wang et al. |
| 2013/0093094 A1* | 4/2013 | Sung ............... H01L 21/78 257/773 |

* cited by examiner

*Primary Examiner* — Michelle Mandala
(74) *Attorney, Agent, or Firm* — Ronald O. Neerings; Charles A. Brill; Frank D. Cimino

(57) ABSTRACT

A backgrind (BG) tape includes an adhesive material having a thinner tape region with a first thickness having an area sized to accommodate a substrate therein including an active semiconductor top side surface including a plurality of chips each including at least one transistor and at least one metallization level with bond pads connected to nodes of the transistor and bumps on or coupled to the bond pads. The BG tape also includes a thicker tape region along at least a periphery of the BG tape having a second thickness that is greater than the first thickness.

35 Claims, 4 Drawing Sheets

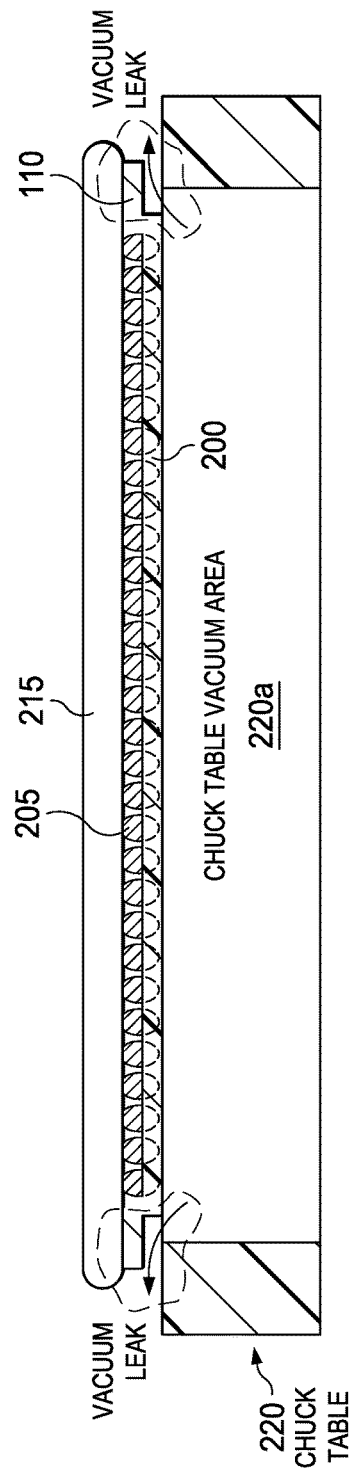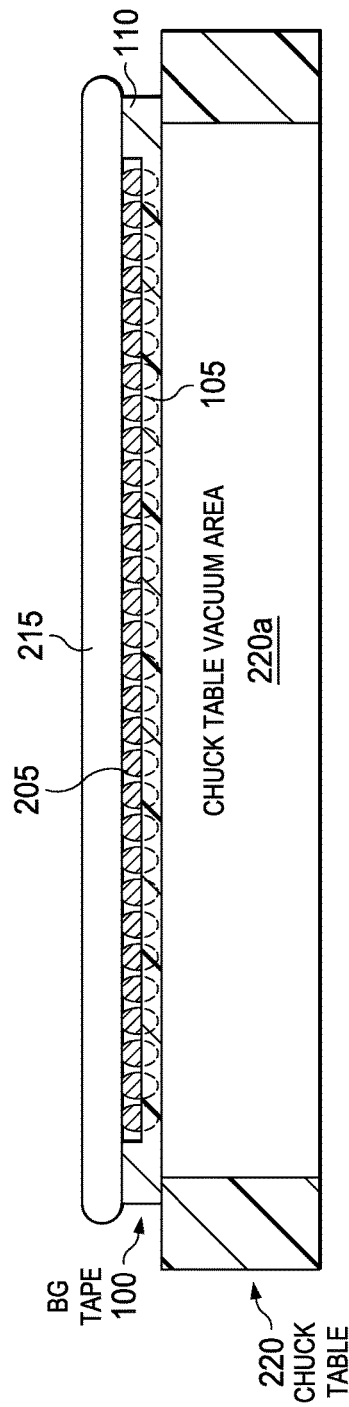

DUAL-THICKNESS BACKGRINDING TAPE FOR BACKGRINDING BUMPED WAFERS

FIELD

Disclosed embodiments relate to semiconductor processing, more specifically to backgrinding of bumped wafers.

BACKGROUND

As semiconductor device sizes have decreased, the density of devices on a chip (or die) has increased, along with the size of the chip, making chip bonding more difficult. Wafer bumping is replacing wire bonding as the interconnection of choice for a growing number of circuits due to lower inductance. The broad term "wafer bumping" is defined as the process by which solder (e.g. a solder alloy), gold, copper, or other metal bumps or balls, is applied onto to the devices at the wafer level to be in connection (e.g., via a redirect layer) with or on the contact pads (or bonding pads). There can be an under bump metallization (UBM) layer between the pads and solder balls.

In a flip-chip configuration, the solder balls are used to make many connections to package substrates (e.g., polymer substrate or a printed circuit board (PCB)), where the chip is inverted and attached onto a package substrate via the solder balls. Since the solder balls can form an area array (a "ball grid array" (BGA)), this arrangement provides a high-density for chip interconnections.

Wafer backgrinding, sometimes referred to as wafer thinning or wafer backlapping, is a post-fabrication semiconductor process by which the thickness of a semiconductor wafer is reduced by grinding down the backside of the wafer. The backgrinding process is applied to the backside of the wafer before singulation and packaging to reduce the thickness of the device which also improves the die's thermal properties. After the solder balls are formed on the active top side surface of the chips, a protective adhesive backgrind tape is applied over the top side surface of the wafer.

Organic-adhesive backgrind tapes are commonly used to secure and protect the bumps during wafer backgrinding processing. During backgrinding the wafer is held by a chuck table that has a porous center chuck portion which allows applying a suction to the taped top side surface of the wafer so that the tape protects the bumps from the chuck table. Using a backgrind apparatus, the backside of the wafer is ground to a predetermined thickness (e.g., 100 µm to 200 µm), followed by de-taping, typically cleaning, singulation (dicing), and then bonding the chip to the package substrate.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments recognize although there is known thin backgrind (BG) adhesive tape (e.g., 100 µm to 200 µm thick, thin relative to the bump size which may be about 400 µm) and known thick BG adhesive tape (e.g., 500 µm to 600 µm thick), both thin and thick BG tape each have significant associated problems. As known in the art the BG tape is typically a soft adhesive material. The thick BG tape is generally thick enough to cover the entire bumps, however during backgrinding the adhesive material tends to become tightly adhered to the substrate (e.g., wafer) surface and thus becomes difficult to remove, leading to BG tape residue remaining after de-taping. For thin BG tape, although tape residue is generally not a problem, since the bumps are not fully covered by the BG tape there may be a resulting significant risk of substrate cracking due to vacuum loss from a vacuum leak during the BG process.

Disclosed BG tape is a dual-thickness BG tape comprising a thinner tape region and a thicker tape region. The thinner tape region corresponds to and frames the substrate location(s) and the thicker tape region is at the periphery of the BG tape and between the thinner tape region(s). The dual-thickness design helps prevent tape residue on the substrate(s) since the thinner tape regions will only be about one quarter to one half the thickness of the bumps, and thicker tape layer regions on the periphery of the tape help compensate against vacuum loss during the grinding process which as noted above can cause substrate (e.g., wafer) cracking during the BG process. Thus, disclosed dual-thickness BG tape protects the bumps on the substrates during backgrinding without any significant risk of adhesive residue being left on the substrates after the de-taping process, as well as a reduction in substrate cracking during the BG process by preventing vacuum loss during BG processing.

BRIEF DESCRIPTION OF THE DRAWINGS

Reference will now be made to the accompanying drawings, which are not necessarily drawn to scale, wherein:

FIG. 2A is a side view depiction that depicts a vacuum leak problem when using a known thin BG tape, where the bumps are not fully covered by the BG tape and there is a resulting vacuum loss from a vacuum leak at the periphery of the chuck during the BG process which risks substrate cracking.

FIG. 2B is a side view depiction that depicts a disclosed dual-thickness BG tape solving the vacuum leak problem when using thin BG tape, where the bumps are not fully covered by the BG tape and because of the thicker tape layer regions on the periphery of the BG tape there is no resulting vacuum loss from a vacuum leak at the periphery during the BG process to eliminate the risk of substrate cracking.

DETAILED DESCRIPTION

Figure 1A:
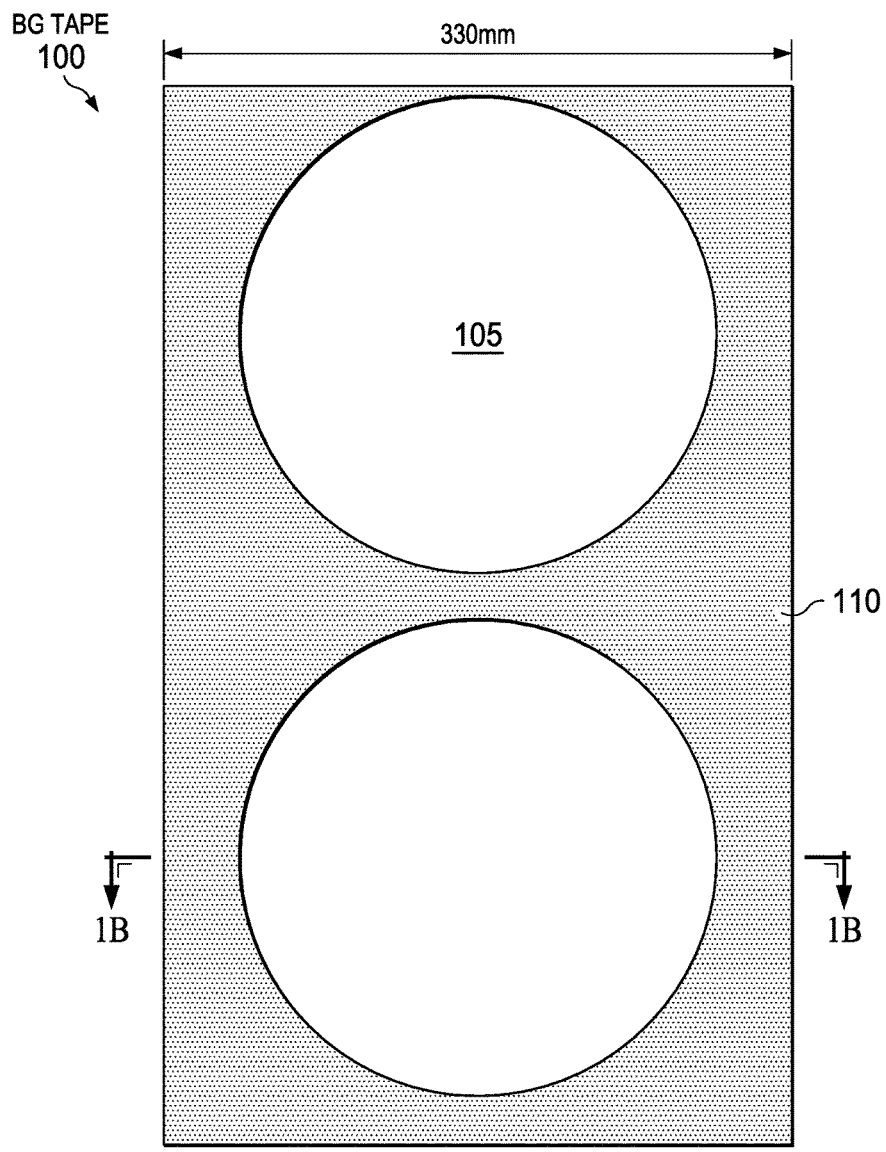
FIG. 1A is a top view of an example dual-thickness BG tape.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Figure 1B:
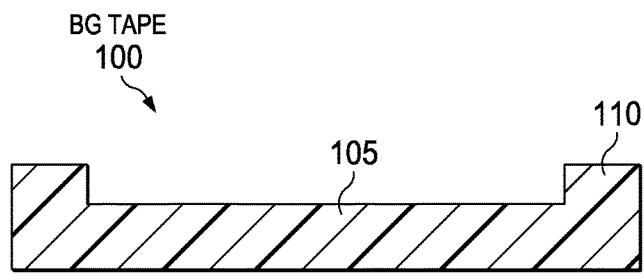
FIG. 1B is a cross sectional view of the BG tape shown in FIG. 1A.

FIG. 1A is a top view of an example dual-thickness tape BG tape 100 and FIG. 1B is a cross sectional view of the BG tape 100 shown in FIG. 1A. BG tape 100 is shown for accommodating 2 substrates. However, disclosed BG tapes can accommodate 1 substrate (e.g., wafer) or 3 or more substrates. The BG tape 100 includes a thinner tape region 105 having a first thickness with an area sized to accommodate a substrate (e.g., wafer) therein and a thicker tape region 110 along at least a periphery of the BG tape having a second thickness greater than the first thickness. The thinner tape region 105 has a shape shown as circular that circumferences an outer edge of the substrate. Non-circular shapes for the thinner tape region 105 may also be used. The second thickness is generally at least 50% greater than the first thickness.

In one embodiment, for 300 mm diameter wafers with 400 µm to 500 µm sized spherical bumps, the thinner tape region 105 has a diameter of about 305 to 310 mm. The bumps are generally spherical in shape. The thinner tape region 105 has a diameter that is larger than the wafer diameter and generally has a thickness of 100 µm to 200 µm. The thicker tape region 110 generally has a thickness of 500 µm to 600 µm. The BG tape 100 can have a width of about 330 µm (a bit more than the substrate diameter) which is the example width dimension shown in FIG. 1A.

There are a variety of ways to form disclosed BG tape. One example formation method comprises molding. Other formation methods are possible.

BG tape 100 can be particularly helpful for current wafer-level package (WLP) technology which uses larger solder balls as the bumps as compared to bumps used in the past typically being spherical and measuring 300 µm to 500 µm in diameter. Solder bumped flip chips typically use solder spheres to electrically connect the device directly to the circuit board or other substrate. The solder bumps are placed on the active top side of the device, either directly on bond pads or routed from the bond pads using a redirect layer (RDL).

FIG. 2A is a side view depiction that depicts a vacuum leak problem while backgrinding using a BG apparatus when using thin BG tape 200, where the bumps 205 are not fully covered by the BG tape 200 and there is a resulting vacuum loss from a vacuum leak at the periphery of the substrate 215 (where there are no bumps 205) during the BG process which thus risks substrate (e.g., wafer) cracking. The BG apparatus is shown including a chuck 220 having a center chuck table vacuum area 220a that the substrate 215 rests on.

FIG. 2B is a side view depiction that depicts disclosed dual-thickness BG tape 100 solving the vacuum leak problem when using thin BG tape, where the bumps 205 are not fully covered by the BG tape. Because of the thicker tape layer regions 110 on the periphery of the tape there is no resulting vacuum loss from a vacuum leak at the periphery during the BG process to eliminate the risk of substrate (e.g., wafer) cracking.

Figure 3A:
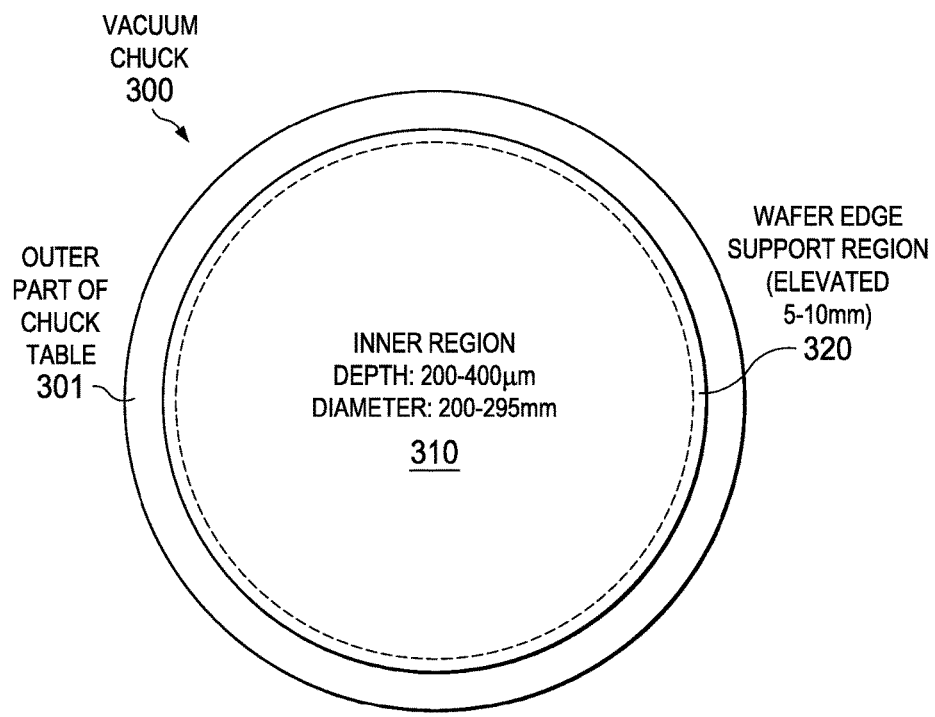
FIG. 3A is a top view depiction of vacuum chuck of a backgrinding apparatus having an inner region and an outer wafer edge support region, according to another embodiment.

FIG. 3A is a top view depiction of vacuum chuck 300 of a backgrinding apparatus having an inner region 310 and an outer wafer edge support region 320, according to another embodiment. The inner region 310 can have a depth from 200 µm to 400 µm (relative to the wafer edge support region 320) and a diameter from 200 to 400 µm, generally being sized for a substrate (e.g., wafer) to fit within. The outer part of the chuck table is shown as 301. The outer wafer edge support region 320 prevents vacuum loss during grinding and cracking during grinding since the non-bumped part of the substrate 215 is supported by an elevated part of the vacuum chuck 300 provided by the outer wafer edge support 320. Vacuum chuck 300 also makes the substrate 215 sit flat on the chuck table even using a thin BG tape, such as a 50 µm to 200 µm thick BG tape.

Figure 3B:
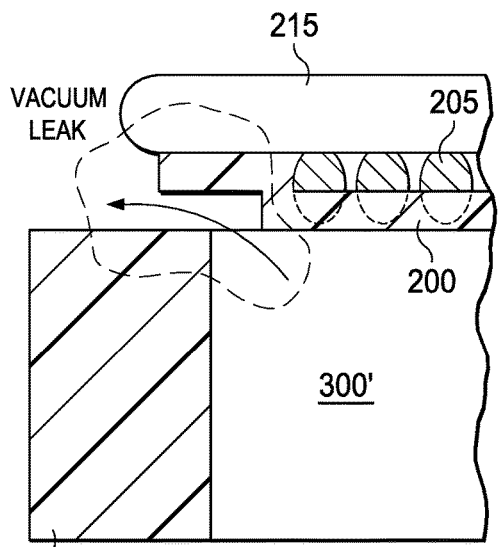
FIG. 3B is a side view depiction of a bumped substrate having bumps with a BG tape on the top side surface of the substrate on a conventional vacuum chuck that has a flat top surface. A vacuum leak along the periphery is shown that can result in cracking the substrate.
Figure 3C:
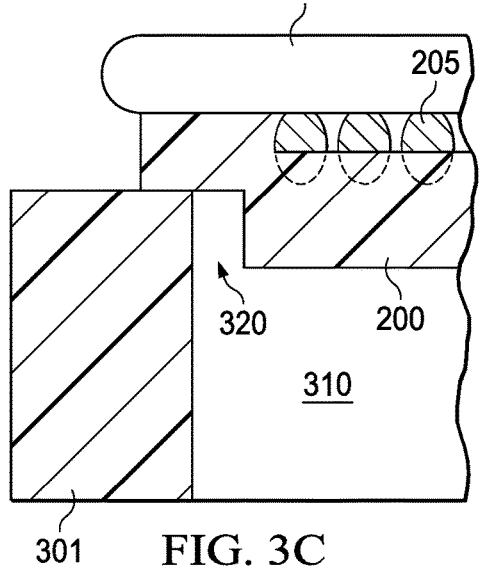
FIG. 3C is a side view depiction of a bumped substrate having bumps with a BG tape on the top side surface of the substrate on the vacuum chuck shown in FIG. 3A that has an inner region and an outer wafer edge support region.

FIG. 3B is a side view depiction of a substrate 215 having bumps 205 with BG tape 200 on the top side surface of the substrate on a conventional vacuum chuck 300' that has a flat top surface. A vacuum leak along the periphery is shown that can also result in cracking of the substrate. FIG. 3C is a side view depiction of a humped substrate 215 having bumps 205 with a BG tape 200 on the top side surface of the substrate on the vacuum chuck 300 shown in FIG. 3A that has an inner region 310 and an outer wafer edge support region 320. Vacuum chuck 300 having the inner region 310 and an outer wafer edge support region 320 prevents vacuum loss during backgrind that can cause downtime or substrate (e.g., wafer) cracking especially on thinner substrates.

Figure 4:
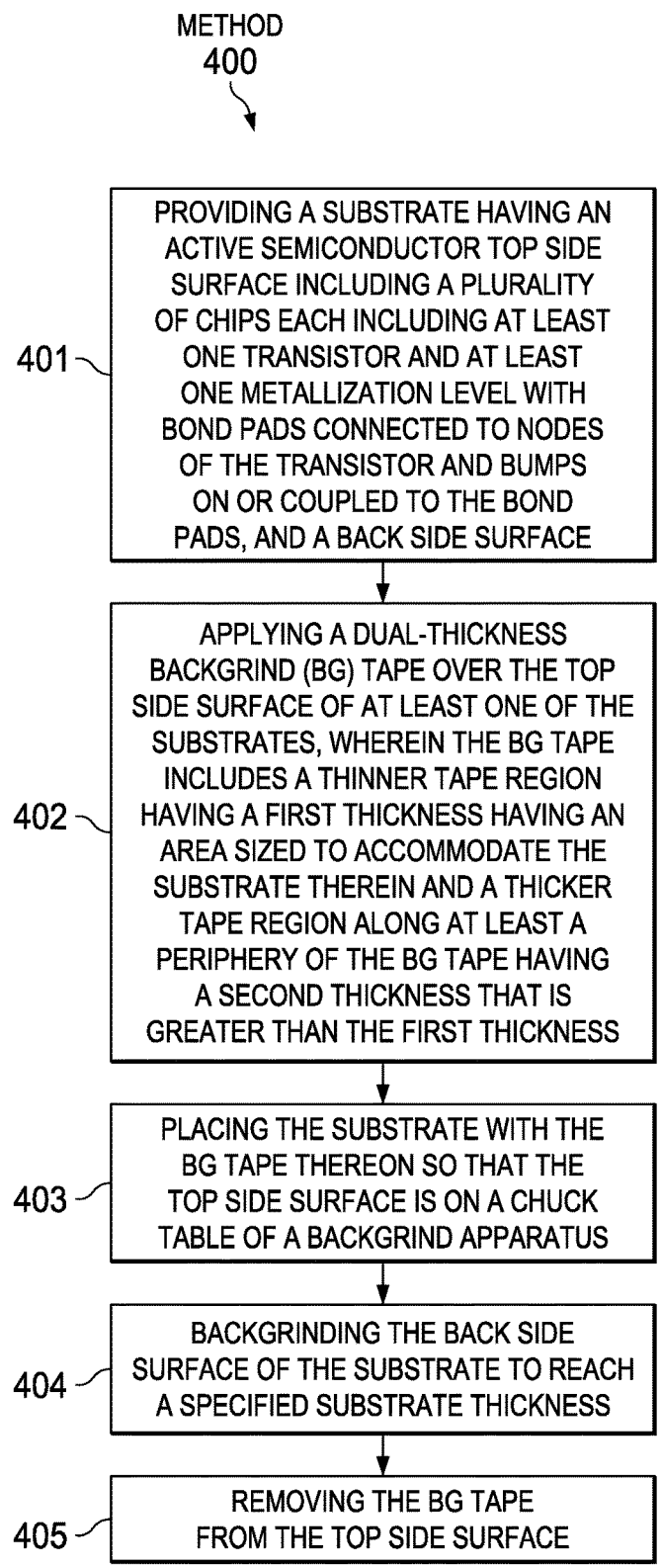
FIG. 4 is a flow chart that shows steps in an example method of backgrinding at least one substrate using a disclosed dual-thickness BG tape, according to an example embodiment.

FIG. 4 is a flow chart that shows steps in an example method 400 of backgrinding at least one substrate using a disclosed dual-thickness tape BG tape, according to an example embodiment. Step 401 comprises providing a substrate having an active semiconductor top side surface (e.g., wafer) including a plurality of chips each including at least one transistor (e.g., an integrated circuit (IC) and resistors, capacitors, and diodes, or discretes such as power MOS) and at least one metallization level with bond pads connected to nodes of the transistor and bumps (e.g., solder) on or coupled to the bond pads, and a back side surface. As known in the art, the substrate typically includes many partially fabricated semiconductor chips, each in a separate region separated by scribe lines. Each of these separate regions becomes a chip when the wafer is singulated, or diced, along the scribe lines. The bumps on the substrate may be arranged into various patterns or arrays and may be of size from several microns to hundreds of microns, or larger.

The bumps can be at least 150 µm, such as at least 300 µm in diameter. The substrate is generally a wafer which has been processed through all integrated circuit chip manufacturing steps through passivation patterning.

Step 402 comprises applying a dual-thickness BG tape over the top side surface of at least one of the substrates, wherein the BG tape includes a thinner tape region having a first thickness having an area sized to accommodate the substrate therein and a thicker tape region along at least a periphery of the BG tape having a second thickness that is greater than the first thickness. The BG tape may be applied to the top side surface of the substrate(s) using, for example, a roller. Tape application machines are manufactured and sold by several companies, such as Takatori, Nitto, Adwill, Advantec and the likes.

The BG tape can have a plurality of thinner tape regions to accommodate a plurality of substrates. The thinner tape region has a shape that circumferences an outer edge of the substrate. The shape can be circular, or a non-circular such as oval, square or rectangular. The BG tape can comprise an organic-adhesive ultraviolet (UV) material having bonds breakable by ultraviolet (UV) light. As used herein, an organic-adhesive tape refers to the adhesive and the backing tape. The adhesive is generally made of an organic material in one of two categories: ultraviolet (UV) tapes and non-UV tapes. The UV tapes employ an adhesive layer having chemical bonds that are broken under UV light so that the tape may be removed more easily. If a UV tape is used, the tape is exposed to UV light at a specified wavelength before it is removed or de-laminated from the wafer.

The second thickness is generally at least 50% greater than the first thickness. For example, the second thickness can be at least 100% greater than the first thickness.

Step 403 comprises placing the substrate with the BG tape thereon so that the top side surface is on a chuck table of a backgrind apparatus. A typical BG apparatus comprises a supporting base with a center porous region and at least one grinding wheel assembly which faces the supporting base. The supporting base typically has a holding table, and the surface of the holding table protrudes beyond the surface of the supporting base. The grinding wheel assembly includes a rotatably mounted support shaft and a grinding wheel mounted to the supporting shaft. In this BG apparatus, a substrate (e.g., wafer) is placed on the surface of the holding table and secured by vacuum. The grinding wheel is rotated by rotating the supporting shaft. The surface of the wafer is ground by moving the supporting base relative the grinding wheel assembly.

Step 404 comprises backgrinding the back side surface of the substrate to reach a specified substrate thickness. After the substrate is ground to the predetermined thickness, the substrate is transferred to a carrier, and the carrier is transferred to a de-taping apparatus where the protective tape is removed from the substrate. Step 405 comprises removing the BG tape from the top side surface. A cleaning process usually follows to remove any residual tape.

Disclosed backgrinding using disclosed dual-thickness BG tape can be integrated into a variety of assembly flows to form a variety of different semiconductor integrated circuit (IC) devices and related products. For example, Wafer Chip Scale Packages (WCSP) and flipchip packages where the chip has tall (e.g. >300 μm) bumps. The assembly can comprise single semiconductor die or multiple semiconductor die, such as PoP configurations comprising a plurality of stacked semiconductor die. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A method of backgrinding, comprising:
providing a substrate having an active semiconductor top side surface including a plurality of chips each including at least one transistor and at least one metallization level with bond pads connected to nodes of said transistor and bumps on or coupled to said bond pads, and a back side surface;
applying a dual-thickness backgrind (BG) tape over said top side surface of at least one said substrate, wherein said BG tape includes a thinner tape region having a first thickness having an area sized to accommodate said substrate therein and a thicker tape region along at least a periphery of said BG tape having a second thickness that is greater than said first thickness;
placing said substrate with said BG tape thereon so that said top side surface is on a chuck table of a backgrind apparatus;
backgrinding said back side surface of said substrate to reach a substrate thickness; and
removing said BG tape from said top side surface.

2. The method of claim 1, wherein said second thickness is at least 50% greater than said first thickness.

3. The method of claim 1, wherein said second thickness is at least 100% greater than said first thickness.

4. The method of claim 1, wherein said thinner tape region has a shape that circumferences an outer edge of said substrate.

5. The method of claim 1, wherein said BG tape comprises an organic-adhesive ultraviolet (UV) material.

6. The method of claim 1, wherein said BG tape comprises a non-UV material.

7. The method of claim 1, wherein said BG tape has a plurality of said thinner tape regions to accommodate a plurality of said substrates.

8. The method of claim 1, wherein said bumps are at least 150 μm in diameter.

9. A method of backgrinding, comprising:
providing a substrate having an active semiconductor top side surface including at least one transistor and at least one metallization level with bond pads connected to nodes of said transistor and bumps on or coupled to said bond pads, and a back side surface;
applying a dual-thickness backgrind (BG) tape over said substrate, wherein said BG tape includes a thinner tape region having a first thickness having an area sized to accommodate said substrate therein and a thicker tape region along at least a periphery of said BG tape having a second thickness that is greater than said first thickness;
placing said substrate with said BG tape thereon so that said top side surface is on a chuck table of a backgrind apparatus;
backgrinding said back side surface of said substrate to reach a substrate thickness; and
removing said BG tape from said top side surface.

10. The method of claim 9, wherein said second thickness is at least 50% greater than said first thickness.

11. The method of claim 10, wherein said second thickness is at least 100% greater than said first thickness.

12. The method of claim 10, wherein said thinner tape region has a shape that circumferences an outer edge of said substrate.

13. The method of claim 10, wherein said BG tape comprises an organic-adhesive ultraviolet (UV) material.

14. The method of claim 10, wherein said BG tape comprises a non-UV material.

15. The method of claim 10, wherein said BG tape has a plurality of said thinner tape regions to accommodate a plurality of said substrates.

16. The method of claim 10, wherein said bumps are at least 150 μm in diameter.

17. A method of making semiconductor chips, comprising:
providing a substrate having an active semiconductor top side surface including a plurality of chips each including at least one transistor and at least one metallization level with bond pads connected to nodes of said transistor and bumps on or coupled to said bond pads, and a back side surface;

applying a dual-thickness backgrind (BG) tape over said top side surface of at least one said substrate, wherein said BG tape includes a thinner tape region having a first thickness having an area sized to accommodate said substrate therein and a thicker tape region along at least a periphery of said BG tape having a second thickness that is greater than said first thickness;

placing said substrate with said BG tape thereon so that said top side surface is on a chuck table of a backgrind apparatus;

backgrinding said back side surface of said substrate to reach a substrate thickness;

removing said BG tape from said top side surface; and singulating the plurality of chips.

18. The method of claim 17, further including packaging the plurality of chips.

19. The method of claim 17, wherein said second thickness is at least 50% greater than said first thickness.

20. The method of claim 17, wherein said second thickness is more than 50% greater than said first thickness.

21. The method of claim 17, wherein said second thickness is at least 100% greater than said first thickness.

22. The method of claim 17, wherein said thinner tape region has a shape that circumferences an outer edge of said substrate.

23. The method of claim 17, wherein said BG tape comprises an organic-adhesive ultraviolet (UV) material.

24. The method of claim 17, wherein said BG tape comprises a non-UV material.

25. The method of claim 17, wherein said BG tape has a plurality of said thinner tape regions to accommodate a plurality of said substrates.

26. The method of claim 17, wherein said bumps are at least 150 μm in diameter.

27. A method of making a semiconductor device, comprising:

providing a substrate having an active semiconductor top side surface including at least one transistor and at least one metallization level with bond pads connected to nodes of said transistor and bumps on or coupled to said bond pads, and a back side surface;

applying a dual-thickness backgrind (BG) tape over said substrate, wherein said BG tape includes a thinner tape region having a first thickness having an area sized to accommodate said substrate therein and a thicker tape region along at least a periphery of said BG tape having a second thickness that is greater than said first thickness;

placing said substrate with said BG tape thereon so that said top side surface is on a chuck table of a backgrind apparatus;

backgrinding said back side surface of said substrate to reach a substrate thickness;

removing said BG tape from said top side surface; and singulating the semiconductor device from other semiconductor devices.

28. The method of claim 27, further including packaging the substrate.

29. The method of claim 27, wherein said second thickness is at least 50% greater than said first thickness.

30. The method of claim 27, wherein said second thickness is at least 100% greater than said first thickness.

31. The method of claim 27, wherein said thinner tape region has a shape that circumferences an outer edge of said substrate.

32. The method of claim 27, wherein said BG tape comprises an organic-adhesive ultraviolet (UV) material.

33. The method of claim 27, wherein said BG tape comprises a non-UV material.

34. The method of claim 27, wherein said BG tape has a plurality of said thinner tape regions to accommodate a plurality of said substrates.

35. The method of claim 27, wherein said bumps are at least 150 μm in diameter.

* * * * *